(12) United States Patent
Behl et al.

(10) Patent No.: US 6,565,163 B2
(45) Date of Patent: *May 20, 2003

(54) RACK FOR MEMORY STORAGE DEVICES

(75) Inventors: Sunny Behl, San Jose, CA (US); Chris Erwin, Fremont, CA (US)

(73) Assignee: Inclose Design, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/751,122

(22) Filed: Dec. 27, 2000

(65) Prior Publication Data

US 2001/0001529 A1 May 24, 2001

Related U.S. Application Data

(62) Division of application No. 09/290,113, filed on Apr. 12, 1999, now Pat. No. 6,193,339.

(30) Foreign Application Priority Data

Apr. 14, 1999 (TW) .......................... 88105921 A

(51) Int. Cl.[7] .............................................. A47B 41/06
(52) U.S. Cl. .................................... 312/223.1; 454/184
(58) Field of Search .......................... 312/223.1, 223.2, 312/222, 333; 361/685, 695, 753, 756; 454/193, 184

(56) References Cited

U.S. PATENT DOCUMENTS

| 5,563,767 A | 10/1996 | Chen ........................... 361/685 |
|---|---|---|
| 5,588,728 A | 12/1996 | Eldridge et al. |
| 5,641,296 A | 6/1997 | Larabell et al. |
| 5,668,696 A | 9/1997 | Schmitt |
| 5,751,551 A | 5/1998 | Hileman et al. ............. 361/753 |
| 5,765,933 A | 6/1998 | Paul et al. |
| 5,767,445 A | 6/1998 | Wu ........................... 174/52.1 |
| 5,791,753 A * | 8/1998 | Paquin ..................... 312/332.1 |
| 6,040,981 A * | 3/2000 | Schmitt et al. ............. 312/221 |
| 6,193,339 B1 | 2/2001 | Behl et al. |

FOREIGN PATENT DOCUMENTS

| DE | 29621713 U1 | 4/1997 |
|---|---|---|
| DE | 19701548 A1 | 8/1997 |

* cited by examiner

*Primary Examiner*—Lanna Mai
*Assistant Examiner*—Jerry A. Anderson
(74) *Attorney, Agent, or Firm*—James D. Ivey

(57) ABSTRACT

A docking adapter for reliably inserting and removing a memory storage device from a memory storage device bay includes a rack and a removable carrier. The rack has a pair of lateral rails for holding the carrier. The carrier slidably engages the rails to enable the carrier to slide into the rack. The carrier is adapted for holding a hard disk drive. The carrier has a face with cooling fans, a cantilever mounted on the face for engaging the rack and a cover with a cam. The cover is hinged to the face. The cover rotates from a closed position where the cover parallels the face to an open position where the cover opens, pressing the cam against the cantilever against the rack to smoothly extract the carrier from the rack.

3 Claims, 7 Drawing Sheets

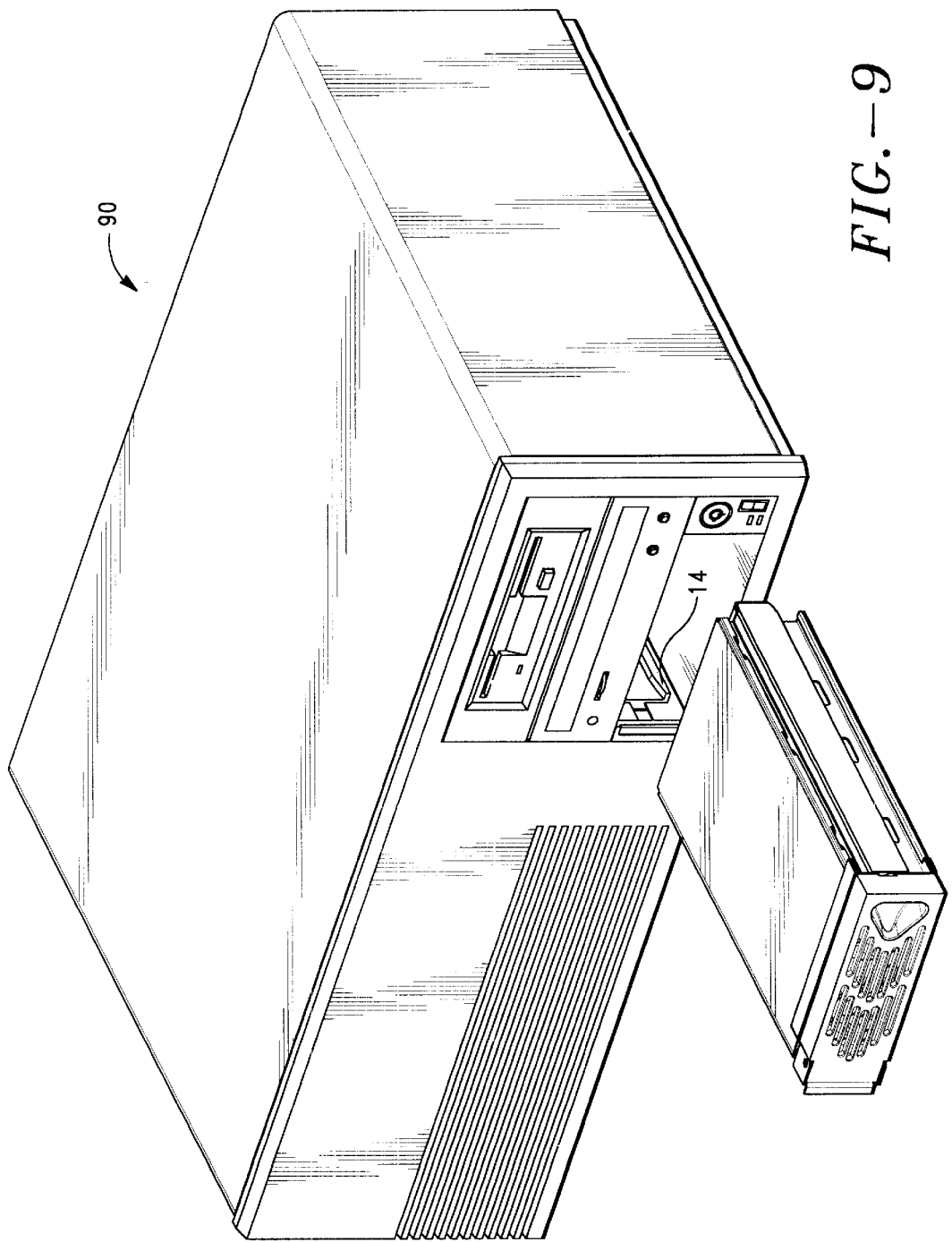
FIG.−9

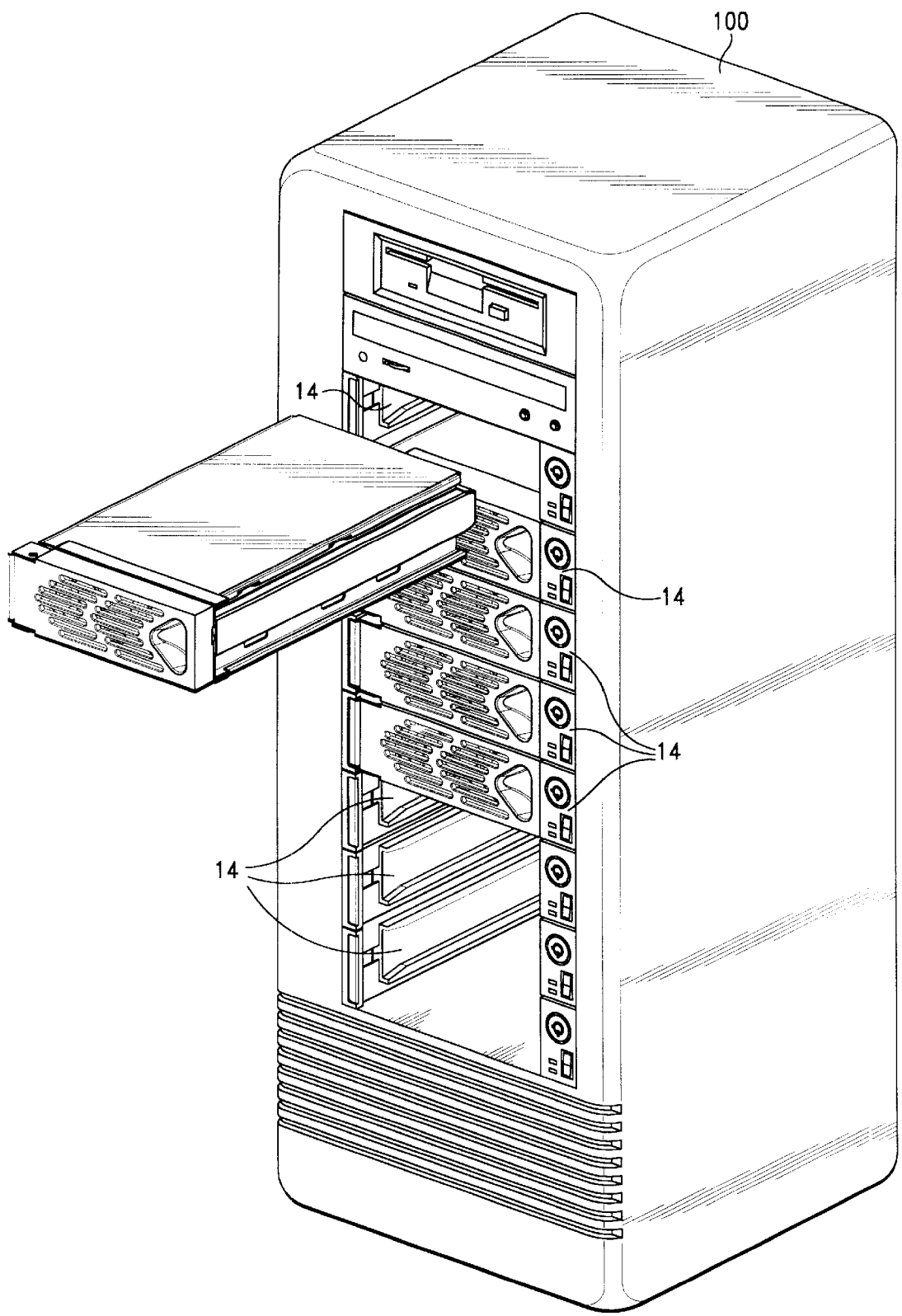
FIG.—10

RACK FOR MEMORY STORAGE DEVICES

This application is a divisional of application Ser. No. 09/290,113, filed Apr. 12, 1999 now U.S. Pat. No. 6,193,339.

FIELD OF THE INVENTION

The present invention pertains to a docking adapter for memory storage devices and, more particularly mobile carrier and rack assemblies for hard disk drives and the like.

BACKGROUND OF THE INVENTION

Docking adapters removeably interconnect memory storage devices to computer systems and memory storage device systems, for example. Docking adapters can provide many advantages over fixed hardware including improved data security, optimization of data backup procedures and sharing of vast amounts of data between non-integrated networks and systems. Docking adapters can also enable multiple users, each with his or her own hard drive, to use a single a machine without interfering with operating settings and data of another.

U.S. Pat. No. Re. 34,369 to Darden et al., the disclosure of which is incorporated herein by reference, discloses a docking adapter for a hard disk drive. The docking adapter includes a carrier for holding a hard drive and a rack that mounts in a computer housing. A connector is included on both the carrier and the rack. The carrier slides into the rack to couple the connectors. A key and lock are provided with the rack to lock and unlock the carrier in the rack. The carrier has a fixed handle to enable removal of the hard disk drive from the rack when the carrier is unlocked.

One drawback to the fixed handle design is that an operator may misalign the carrier with respect to the rack during insertion and removal of the carrier. Should the operate wiggle the carrier with the fixed handle, the connector that couples the carrier with the rack may be damaged.

U.S. Pat. No. 5,563,767 to Chen, the disclosure of which is incorporated herein by reference, discloses a docking adapter having a carrier and a rack. The carrier has a rotatable handle. The handle includes a disengagement mechanism (221) that cams directly against the rack to urge the carrier from the rack when the handle lifts.

One drawback to the device disclosed by Chen is that the handle lifts. As the handle lifts, the disengagement mechanism rotates against the rack and adds to this lifting force. As a result, the frontal portion of the carrier experiences a lifting force that may misalign the carrier with respect to the rack, damaging the connectors that couple the carrier to the rack.

Both the Darden et al. device and the Chen device have a lock that operates independently of the handle. When an over zealous operator pulls on the handle when the carrier is locked, the docking adapter may break. What is desired is a way of preventing the carrier and rack from being damaged during use.

Hard disk drives generate heat. Chen provides for vents to convectively cool any enclosed hard disk drive. The Chen device has vents and appears to be fabricated from injection molded plastic, which is typically a poor heat conductor. While the vents enable convective cooling under certain conditions, convective cooling may fail in systems that lack enough space for sufficient air flow. What is desired is a way of better cooling a hard disk drive in a mobile carrier and rack assembly.

Commonly assigned U.S. patent application Ser. No. 08/926,874, the disclosure of which is incorporated herein by reference introduces the concept providing a hard drive with a heat sink. Heat sinks vastly improve conductive cooling of hard drives over the capabilities of a plastic carrier, for example.

Docking adapters have connectors for coupling carriers with the rack. It has been found that durability of the connectors may be compromised due to excessive handling and repetitive insertion and removal of the carrier from the rack. It is possible that that friction between a plastic carrier and plastic rack can cause the carrier to resist movement in the rack. To overcome static friction, an operator must force the carrier to move with respect to the rack. Forcing the carrier may misalign the carrier and the rack and can ultimately cause failure of the data connector that couples the hard drive carrier with the rack. What is desired is a way of minimizing any force required to dock and undock a carrier and rack. What is also desired is a way to improve docking adapter reliability.

SUMMARY OF THE INVENTION

The present invention includes a memory storage device carrier and rack. The carrier holds a memory storage device such as a hard disk drive. The carrier smoothly inserts and removes the hard disk drive into and out of a fixed rack. The rack may be fixed in a computer housing, or a memory storage device housing for example. The carrier of the present invention can carry hard disk drives, optical drives, floppy drives and other memory storage media.

The carrier is portable for moving a hard drive from one machine to another. Carriers may be adapted to enable alternate memory storage devices, i.e. optical drives, PCMCIA drives, flash memory cards and hard disk drives to be interchanged in a single rack.

The rack is typically fixed in a hosing such as a computer housing or a RAID tower, and the like. The rack has two lateral rails. Each rail includes a slide bearing for sliding the carrier into and out from the racks. While rails are disclosed for holding the slide bearings, it can be appreciated that the rack may be fully enclosed for holding the slide bearings, or the slide bearings may be integrated into a computer housing, for example. Further, the rack rails may be integrated into an external-type hard drive rack.

A cantilever mounts on the face for engaging the rack. A cover rotatably attaches to the carrier. The cover has an end that forms a cam. The cover rotates from a closed position where the cover parallels the face to an open position. The cam presses the cantilever against the rack as the cover opens.

The cantilever has a contoured end, a fulcrum region, and a fixed end. The fixed end is fixed to the face. The fulcrum region contacts the cam when the cover angles with respect to the face of the carrier. The contoured end of the cantilever engages one rail of the rack to undock the carrier from the rack.

The cantilever is resilient and bends in response to rotation of the cam to dampen shock associated with insertion and removal of the carrier from the rack. The fixed end of the cantilever attaches to the center of the face of the carrier to optimize alignment of the carrier when the carrier slides into the rack. The contoured end absorbs shock such as when the carrier is shoved into the rack. Bending of the cantilever further buffers the insertion of the carrier into the rack. The cantilever, however, is relaxed when the carrier inserts into the rack and the cover is closed.

BRIEF DESCRIPTION OF THE DRAWINGS

FIG. 9 shows a rack integrated into a personal computer.

FIG. 10 shows the rack integrated into a memory storage device tower.

DETAILED DESCRIPTION

Figure 1:
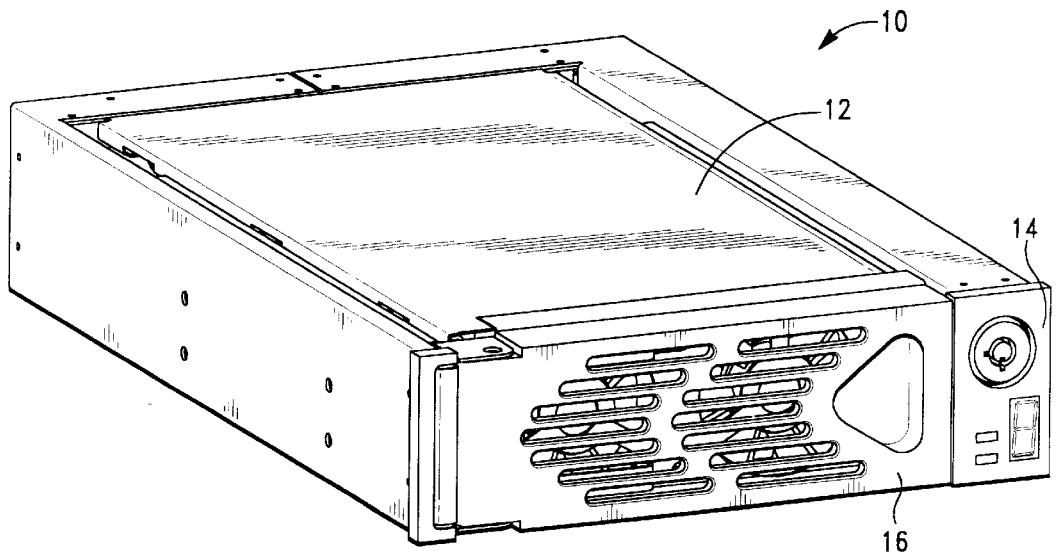
FIG. 1 shows a perspective view of a docking adapter in accordance with the present invention.

FIG. 1 shows a memory storage device docking adapter generally designated with the reference numeral 10. The docking adapter 10 includes a carrier 12 and a rack 14. The carrier 12 has a cover 16 that opens and closes to remove the carrier 12 from the rack 14. The carrier 12 is particularly suited for housing a hard disk drive, or other memory storage device. The carrier 12 is fabricated from sheet metal to conduct heat from the carrier and to shield electromagnetic interference between electronics housed by the carrier 12.

Figure 2:
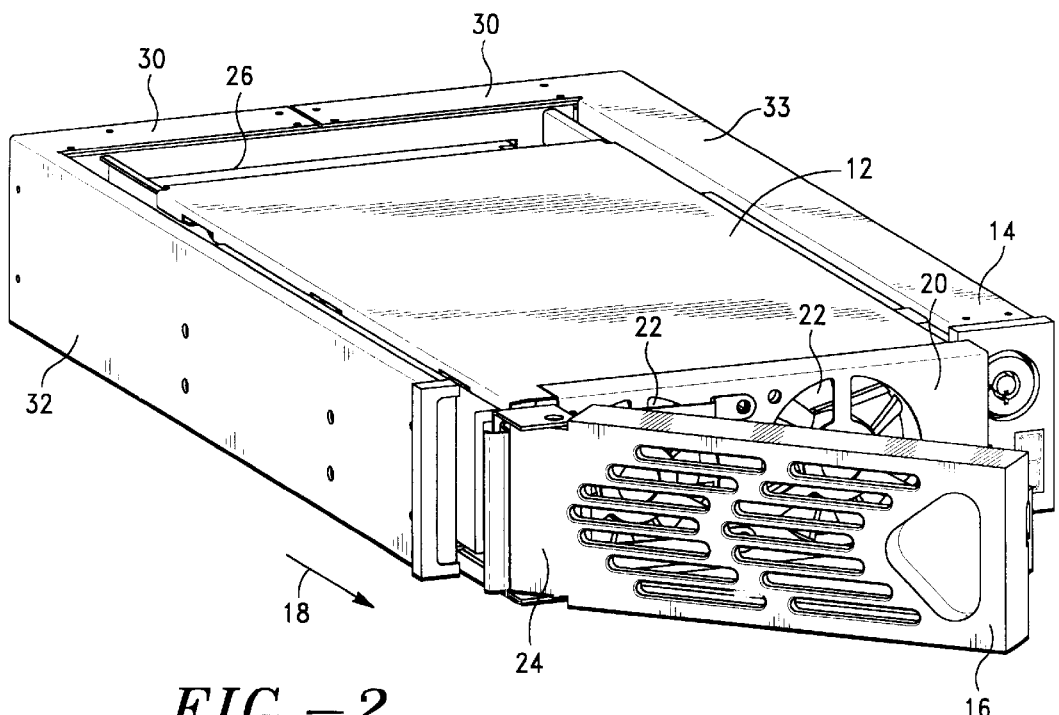
FIG. 2 shows a perspective view of the docking adapter of FIG. 1 with the carrier sliding out from the rack.

FIG. 2 shows the cover 16 opening and the carrier 12 sliding out from the rack 14 in the direction of the arrow 18. The carrier 12 has a face 20 and fans 22 mounted to the face 20 for blowing air through the carrier 12 to convectively dissipate heat. The cover 16 is vented to facilitate air flow though the carrier 12.

The cover 16 rotates from a closed position as shown in FIG. 1 where the cover 16 lies parallel to the face 20 to an open position where the cover 16 angles with respect to the face 20. The cover 16 includes a hinged end 24 with a cam. When the cover 16 opens, the hinged end 24 rotates, causing the carrier 12 to slide out from the rack 14.

The rack has a backplane 26 and two lateral rails 32 and 33 extending from the backplane for holding the carrier 12 in alignment with the rack 14. The carrier 12 slidably engages the rails 32 and 33 to enable the carrier 12 to slide out from and into the rack 14.

The rack 14 is fabricated from sheet metal for several reasons. Sheet metal e.g. steel is durable, conducts heat well and shields electromagnetic interference. The rails 32 and 33 are each fabricated from a single piece of metal for ease of manufacture. Each rail 32 and 33 includes integrated tabs 30 that attach to the rails 32 and 33 of the backplane 26.

Figure 3:
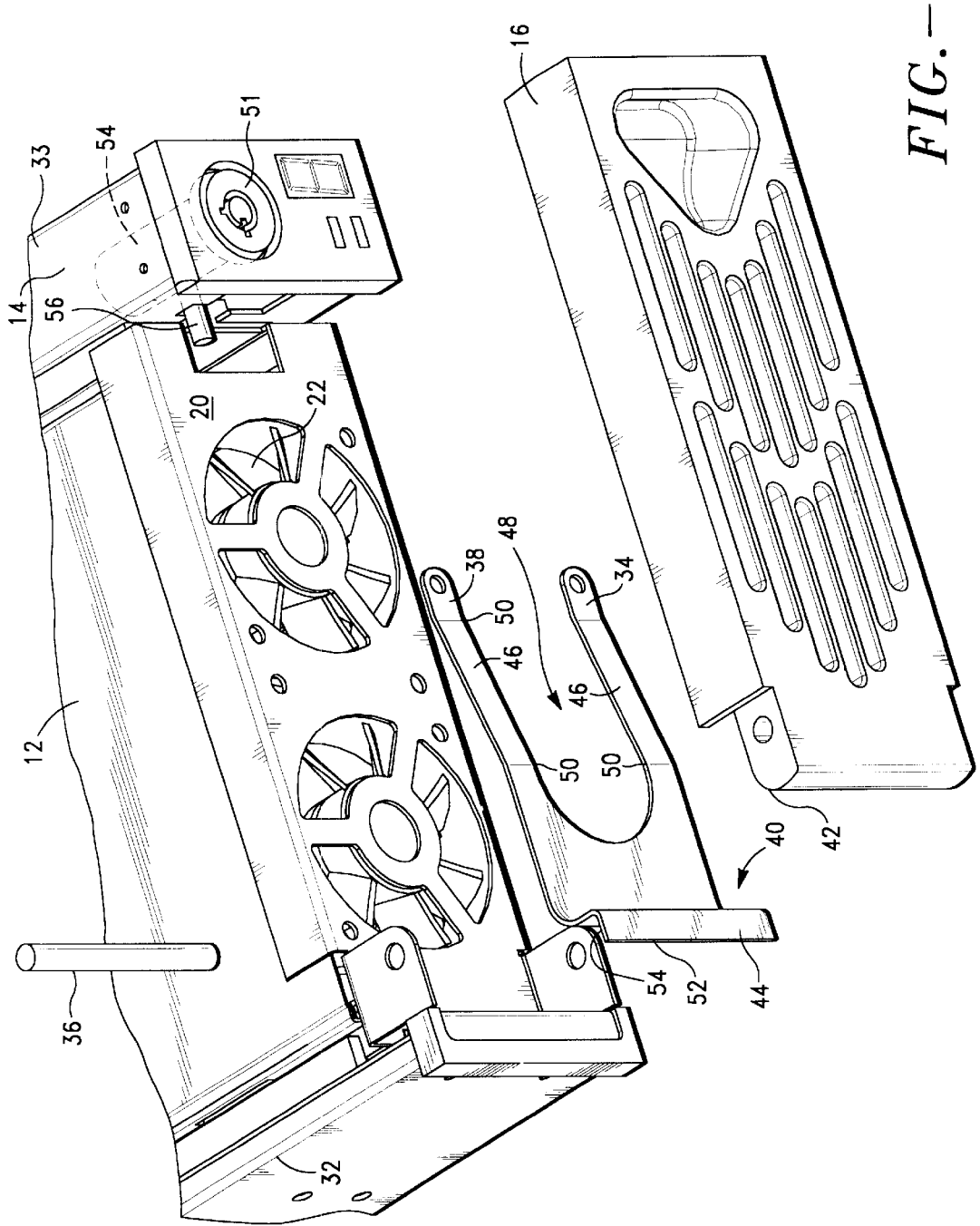
FIG. 3 shows an exploded view of the carrier cover.

FIG. 3 shows the carrier 12 having the fans 22, the cover 16, a cantilever 34 and a hinge pin 36. The carrier 12 face 20 has a center. The cantilever 34 attaches to the center of the face 20 so that force applied by the cantilever 34 to the face 20 will not significantly misalign the carrier 12 with respect to the rack 14. The hinged end 24 of the cover includes the cam 42.

The cantilever 34 has a fixed end 38 that mounts to the face 20 of the carrier 12. The cantilever 34 includes a fulcrum region 40 that aligns with and contacts the cam 42 of the cover 16. The cantilever 34 also includes a contoured end 44 that engages the rail 32 of the rack 14.

When the cover 16 rotates from the closed position (FIG. 1) where the cover 16 parallels the face 20 to an open position (FIG. 2), the cam 42 contacts the fulcrum region 40, pressing the contoured end 44 of the cantilever 34 against the rack 14.

The cantilever 34 is bifurcated having two legs 46. Each leg 46 independently attaches to the center of the face 20. The bifurcated cantilever 34 defines an opening 48 between the legs 46. The opening 48 enables air to flow out of the carrier 12 through the fans 22 and the cantilever 34. It can be appreciated that the legs 46 can assume any of a variety of configurations that allow air to pass through the cantilever. For example the legs may define a frame, grate, screen or other mechanism for enabling air to pass through the cantilever.

The cantilever 34 is resilient and bends. The cantilever 34 is formed with angled portions 50 that function as a leaf spring. The angled portions 50 also distance portions of the cantilever 34 from the face 20 of the carrier 12. The angled portions 50 prevent the face 20 from interfering with flexion of the cantilever 34 when the cantilever 34 bends. Typically the cam 42 flexes and bends the cantilever 34 when the cam 42 rotates. The cantilever 34 flexes to dampen shock associated with removal of the carrier 12 from the rack 14.

The cantilever 34 also flexes during insertion of the carrier 12 into the rack 14. When the contoured end 44 of the cantilever 34 contacts the rail 32 of the rack 14, and the carrier 12 further inserts into the rack 14, the cantilever 34 flexes to absorb shock. Such flexion presses the fulcrum region 40 into the cam 42 to rotate the cam 42 and automatically close the cover 16 when the cover 16 is open during insertion of the carrier into the rack. It can be appreciated, however, that it is preferred to closed the cover prior to inserting the carrier 12 into the rack 14.

The contoured end 44 of the cantilever 34 has a lateral face 52 and a posterior face 54. The lateral face 52 presses against one rail 32 to laterally align the carrier 12 with respect to the lateral rail 32 of the rack 14. The rail 32 has an axis. The posterior face 54 opposes the face 20 of the carrier 12. The posterior face 54 presses against the rail 32 when the cover 16 opens.

The rack 14 includes a lock 51 with a rotating cylinder 54 and a locking arm 56 attached to the lateral rail 33. The cylinder 54 rotates the locking arm 56 into contact with the cover 16 to lock the cover 16 in the closed position. The locking arm 56 contacts the face 20 of the carrier 12. The locking arm 56 thereby holds the carrier 12 in the rack 14 by contacting both the face 22 of the carrier 12 and the cover 16.

Figure 4:
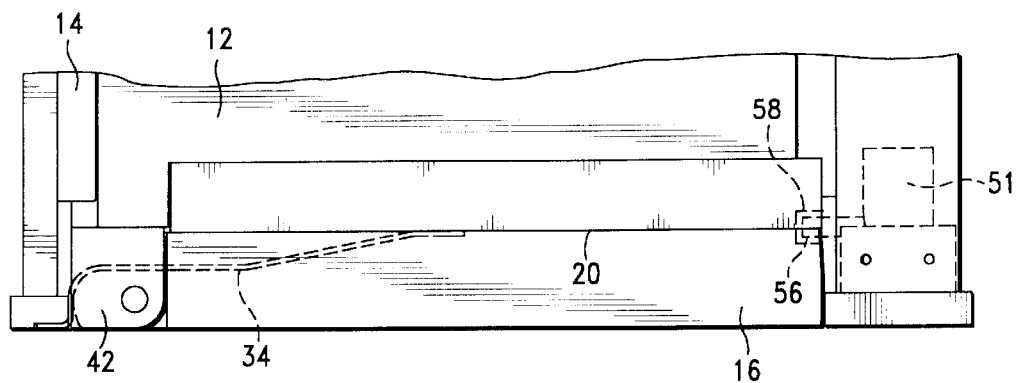
FIG. 4 shows a top view of the present invention with the cover closed.

FIG. 4 shows the lock 51 with the locking arm 56 extending through an opening 58 in the cover 16. The locking arm 56 holds the cover 16 in the closed position and holds the carrier 12 in the rack 14.

Figure 5:
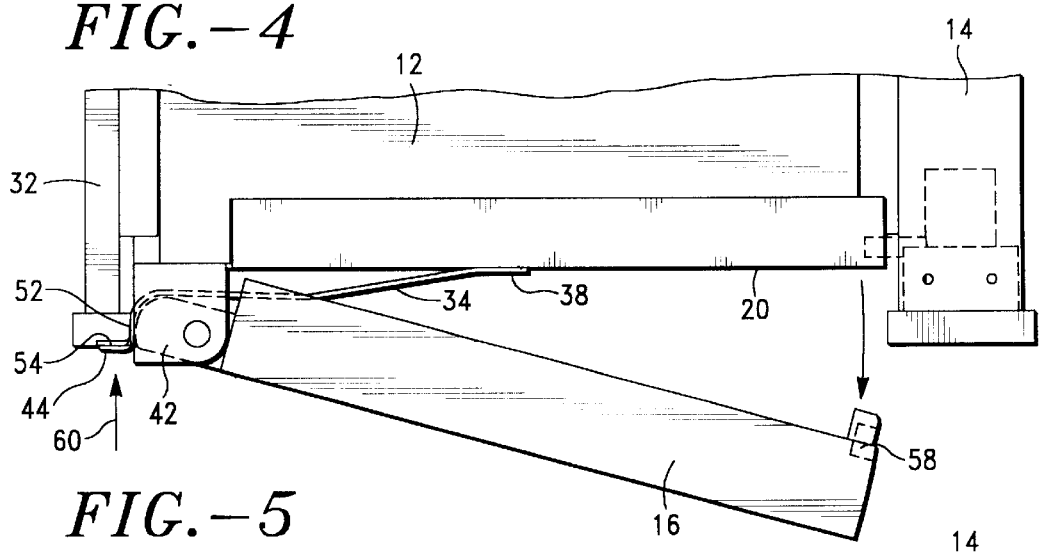
FIG. 5 shows a top view of the present invention with the cover opening.

FIG. 5 shows the cover 16 opening. The cam 42 presses against the lever 34, causing the contoured end 44 of the lever 34 to press against the lateral rail 32 of the rack 14. The lateral face 52 of the contoured end 44 presses laterally against the lateral rail 32 of the rack 14 to align the carrier 12 in the rack 14. The posterior face 54 of the contoured end 44 presses against the lateral rail 32 in the direction of the arrow 60.

The fixed end 38 of the cantilever 34 against the center of the face 20 prevents the cantilever 34 from disturbing the alignment between the carrier 12 and the rack 14. The operation of the cover 16, the cam 42 and the lever cause sufficient force in the direction of the arrow 60 to decouple the carrier 12 from the rack 14 while maintaining alignment between the carrier 12 and the rack 14. Maintaining alignment is important to protect connectors that electronically couple the carrier 12 with the rack 14.

Figure 6:
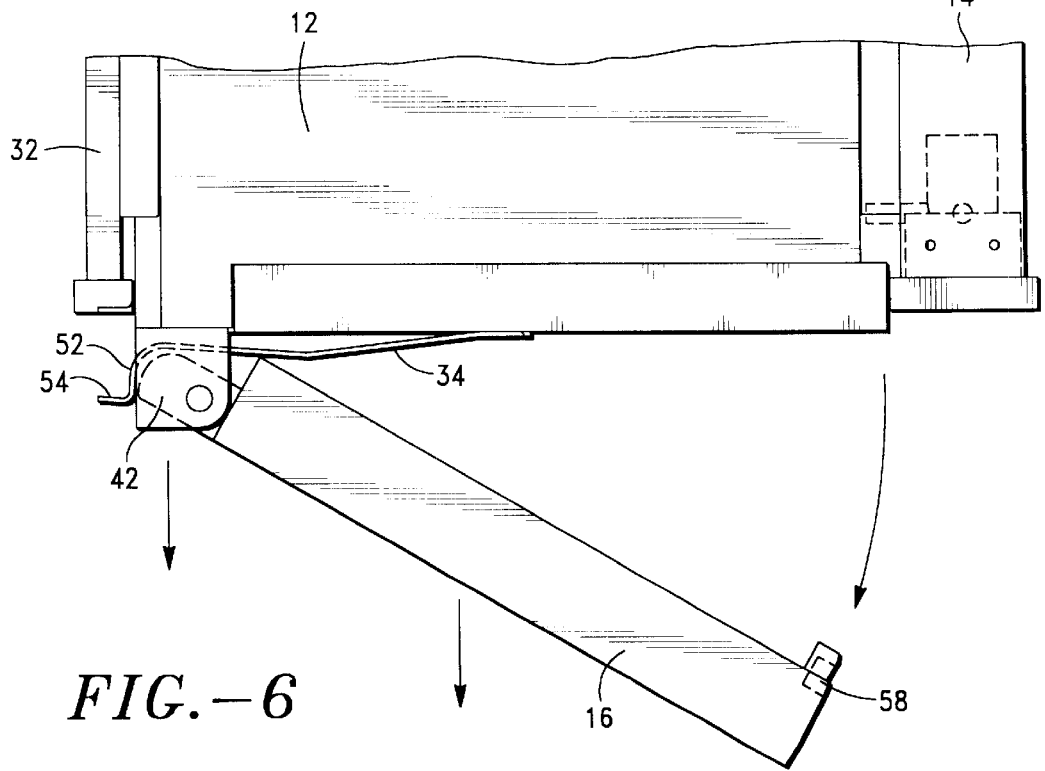
FIG. 6 shows a top view of the present invention with the cover opened.

FIG. 6 shows the carrier 12 sliding out from the rack 14. The action of the cam 42 and cantilever 34 against the rack 14 de-couples the carrier 12 from the rack 14.

Figure 7:
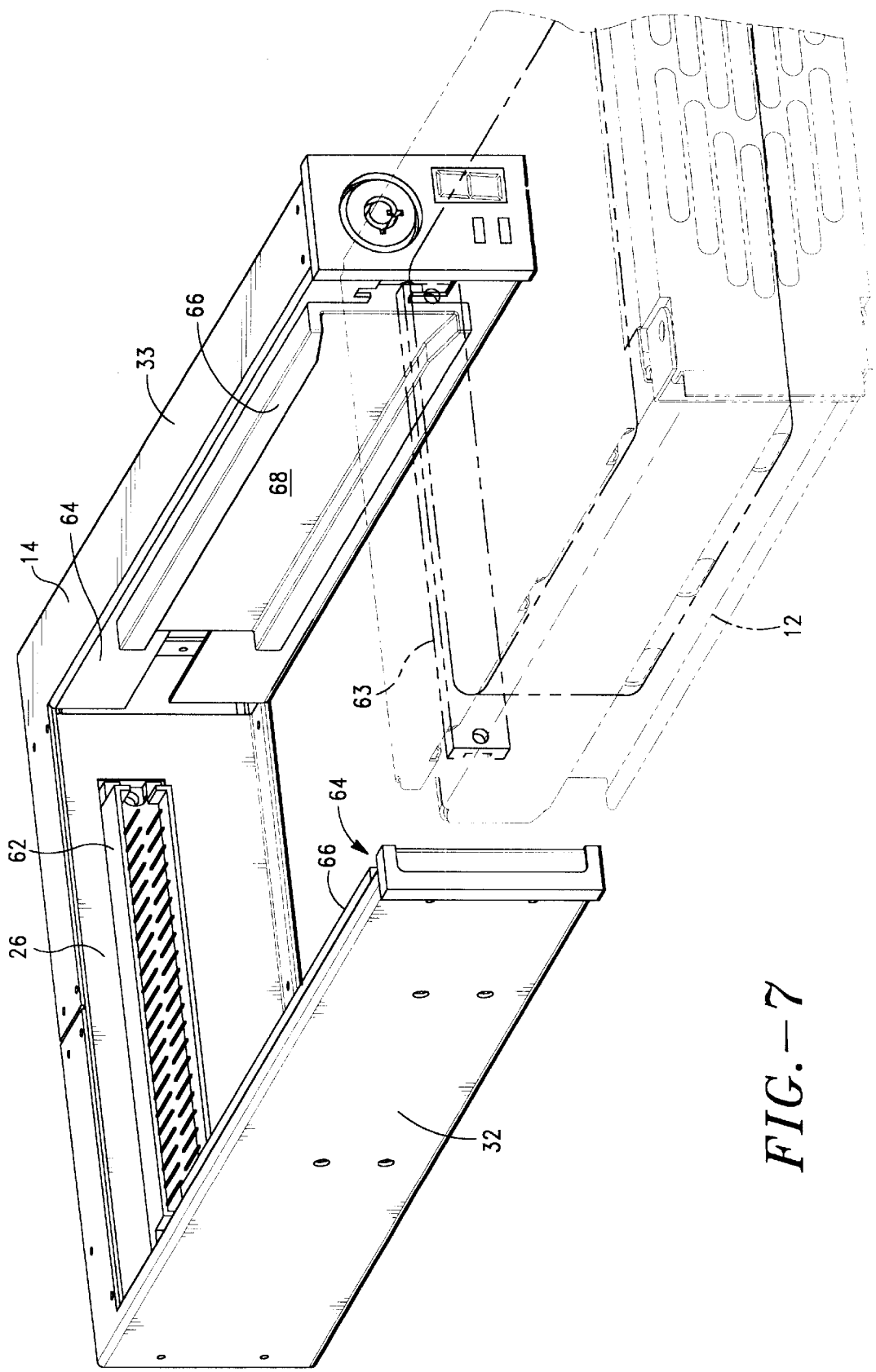
FIG. 7 shows a perspective view of the rack of FIG. 1.

FIG. 7 shows the carrier 12 in alignment with the rack 14. The rack 14 includes the back plane 26 having a connector 62 for coupling the rack 14 with the carrier 12. The carrier has a connector 63 that couples with the connector 62.

The lateral rails 32 and 33 extend from the backplane 26 to align the carrier 12 with the connector 62. The lateral rails 32 and 33 have a inner sides 64 and a slide bearing 66 fixed to each inner side 64. The slide bearing 66 has a smooth bearing surface 68 for sliding the carrier along the rails 32 and 33.

According to one aspect of the invention, the lateral rails 32 and 33 are fabricated from sheet metal and the slide bearings 66 are fabricated from nylon. According to an alternate aspect of the invention, the lateral rails 32 and 33 are fabricated from sheet metal and the slide bearings 66 are fabricated from a lubricous polymer. It can be appreciated that the bearing surface 68 conforms to whatever shape the carrier has so the bearing surface 68 may be planar, contoured, or may have various angles.

Figure 8:
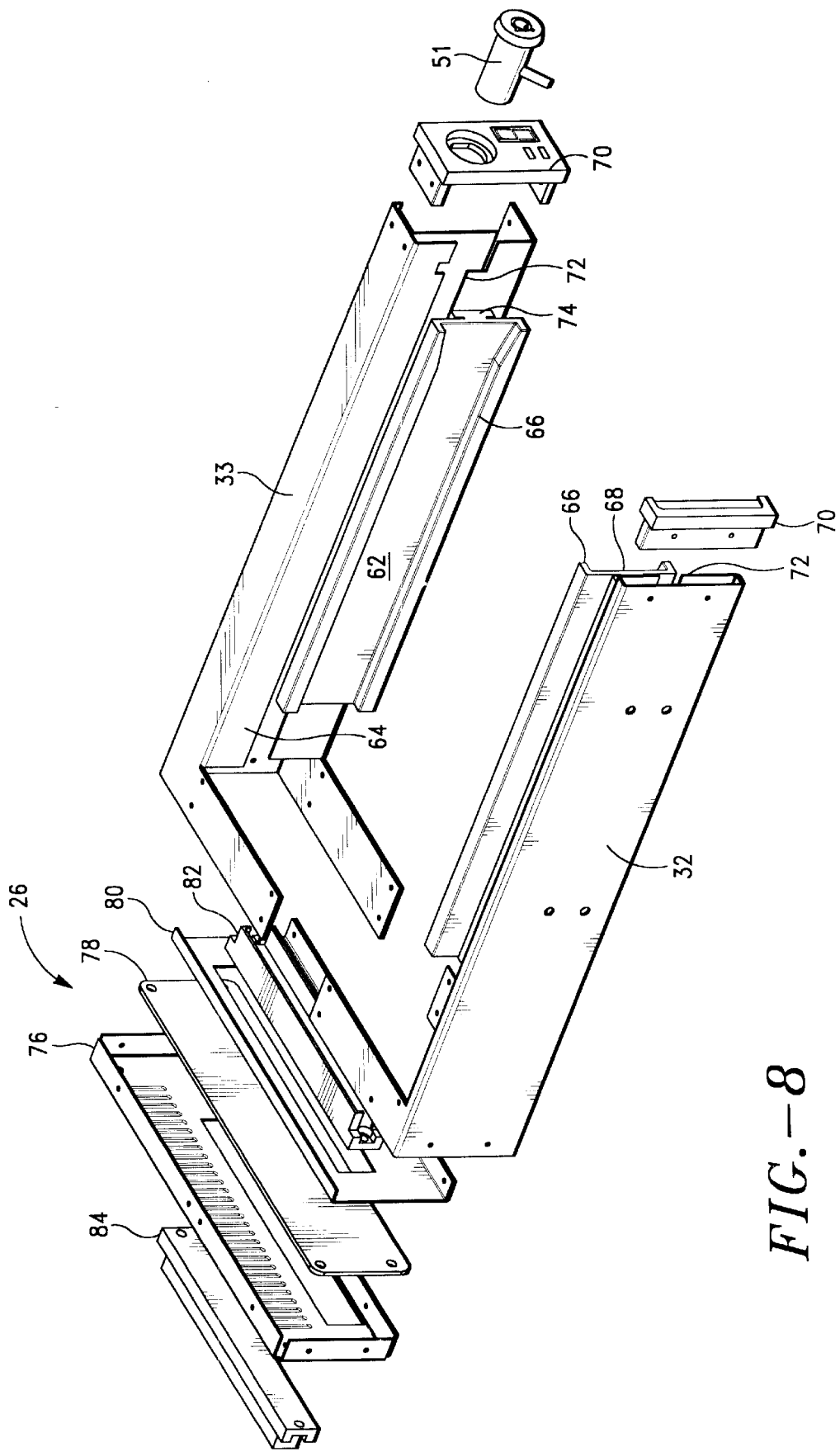
FIG. 8 shows an exploded perspective view of the rack of FIG. 7.

FIG. 8 shows each lateral rail 32 and 33 having an end cap 70 to maintain the shape of each lateral rail 32 and 33 respectively. The lock 52 mounts on one end cap 70.

The lateral rails 32 and 33 each include a groove 72 formed on the inner sides 64 for receiving the slide bearing 66. The slide bearing 66 has "T" shaped extension 74 that inserts into the groove 72 to hold the slide bearing 66 with respect to the lateral rails 32 and 33, respectively.

The backplane 26 includes a vented section of sheet metal with a connector opening, an adapter board 78, a frame 80 and connectors 82 and 84. The connector 82 couples with the carrier 12 (FIG. 1), the other connector 84 couples with a hard drive controller, for example.

FIG. 9 shows a personal computer 90. The rack 14 is integrated into a memory storage device bay of the personal computer 90. FIG. 10 shows a memory storage device tower 100. Multiple racks 14 are integrated into the memory storage device tower 100.

The present invention may be modified in any of a variety of ways without departing from the scope of the appended claims. For example, the slide bearings may include roller bearings and multiple rails that slide with respect to each other such as commonly seen in desk, or file cabinet drawers. Accordingly, the scope of this invention is to be limited only by the claims below.

What is claimed is:

1. A memory storage device docking adapter, comprising:

a carrier for holding a hard disk drive, the carrier has a face;

a rack having two lateral rails, the carrier slidably engages the rails to enable the carrier to slide into the rack;

a cantilever mounted on the face for engaging the rack;

a cover with a cam, the cover is hinged to the face, the cover rotates from a closed position where the cover parallels the face to an open position where the cam presses the cantilever against the rack;

the face includes at least one fan to blow air through the docking adapter; and wherein the cantilever is bifurcated having two legs, the cantilever defines an opening between the legs to facilitate airflow through the fan.

2. A memory storage device docking adapter, comprising:

a carrier for holding a hard disk drive, the carrier has a face;

a rack having two lateral rails, the carrier slidably engages the rails to enable the carrier to slide into the rack;

a cantilever mounted on the face for engaging the rack;

a cover with a cam, the cover is hinged to the face, the cover rotates from a closed position where the cover parallels the face to an open position where the cam presses the cantilever against the rack; and wherein the cantilever is resilient and bends in response to the cam to dampen shock associated with insertion and removal of the carrier form the rack.

3. The docking adapter as set forth in claim 2, wherein the rack includes a lock with a rotating cylinder and a locking arm attached to one lateral rail, the cylinder rotates the locking arm into contact with the cover to lock the cover in the closed position, and the locking arm contacts the face of the carrier thereby holding the carrier in the rack by contacting both the face of the carrier and the cover.

\* \* \* \* \*